US012542555B2

(12) United States Patent
Chinthu et al.

(10) Patent No.: US 12,542,555 B2
(45) Date of Patent: Feb. 3, 2026

(54) CUSTOMIZABLE LOGIC CELL WITH METHODS TO FORM SAME

(71) Applicant: GlobalFoundries U.S. Inc., Malta, NY (US)

(72) Inventors: Siva Kumar Chinthu, Bangalore (IN); Venu Gopal Reddy Ara, Bangalore (IN); Devesh Dwivedi, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 283 days.

(21) Appl. No.: 18/313,427

(22) Filed: May 8, 2023

(65) Prior Publication Data
US 2024/0380400 A1    Nov. 14, 2024

(51) Int. Cl.
*H03K 19/0185*   (2006.01)
*H03K 19/0175*   (2006.01)
*H03K 19/20*   (2006.01)

(52) U.S. Cl.
CPC ............... *H03K 19/018521* (2013.01); *H03K 19/017509* (2013.01); *H03K 19/20* (2013.01)

(58) Field of Classification Search
CPC ........... H03K 19/018521; H03K 5/133; H03K 19/20; H03K 19/017509; H03K 19/17724; H03K 19/17796
See application file for complete search history.

(56) References Cited

U.S. PATENT DOCUMENTS

| | | | |
|---|---|---|---|
| 5,043,605 A | 8/1991 | Gabara | |
| 5,095,230 A * | 3/1992 | Takai | H03M 5/20 326/60 |
| 5,192,879 A * | 3/1993 | Aoki | H03K 19/00361 326/27 |
| 6,426,650 B1 | 7/2002 | Dufour et al. | |
| 6,446,248 B1 | 9/2002 | Solomon et al. | |

(Continued)

FOREIGN PATENT DOCUMENTS

| TW | 201628334 A | 8/2016 |
|---|---|---|
| TW | 202018704 A | 5/2020 |

OTHER PUBLICATIONS

European Search Report for corresponding EP Application No. 23208142.2-1201 dated May 8, 2024, 9 pages.

(Continued)

*Primary Examiner* — Daniel D Chang

(74) *Attorney, Agent, or Firm* — David Cain; Hoffman Warnick LLC

(57) ABSTRACT

Embodiments of the disclosure provide a customizable logic cells and related methods to form the same. A structure of the disclosure includes a first pair of complementary transistors connected in series between a first voltage node and a second voltage node. Each transistor of the first pair includes a gate coupled to a first input node. A second pair of complementary transistors is connected in series between the first voltage node and the second voltage node in an opposite orientation from the first pair of complementary transistors. Each transistor of the second pair includes a gate coupled to a second input node. An output line is coupled to a first electrical connection between the first pair complementary transistors and a second electrical connection between the second pair of complementary transistors.

14 Claims, 8 Drawing Sheets

(56) References Cited

U.S. PATENT DOCUMENTS

| | | | |
|---|---|---|---|
| 2007/0180185 A1* | 8/2007 | Hein | G11C 11/4093 |
| | | | 711/100 |
| 2007/0247194 A1 | 10/2007 | Jain | |
| 2008/0143385 A1* | 6/2008 | Hanna | H03K 19/0948 |
| | | | 326/68 |
| 2020/0394274 A1 | 12/2020 | Sengupta et al. | |

OTHER PUBLICATIONS

Anonymous et al., "Design Problem: How can you convert an XOR gate into a buffer or an inverter?" VLSI Universe, retrieved from: https://vlsiuniverse.blogspot.com/2017/11/design-problem-how-can-you-convert-xor.html on Jan. 27, 2023, 4 pages.

Anonymous et al., "How do you design a CMOS buffer with exact same delay of a CMOS inverter?" retrieved from: https://electronics.stackexchange.com/questions/244585/how-do-you-design-a-cmos-buffer-with-exact-same-delay-of-a-cmos-inverter on Jan. 27, 2023, 7 pages.

* cited by examiner

CUSTOMIZABLE LOGIC CELL WITH METHODS TO FORM SAME

BACKGROUND

The disclosure relates to integrated circuit (IC) structures. More specifically, embodiments of the disclosure provide a customizable logic cell with related methods to form the same. The manufacturing of ICs includes, among other things, forming a device layer including transistors and/or other active components, and a plurality of back end of line (BEOL) layers defining vertically and horizontally extending interconnections to/between various components of the device layer. Errors and defects may occur in the case where the BEOL layers, when formed, cause logic gates defined within the device to implement the incorrect logic. For instance, "logic inversion" refers to a case where inverting gates act as non-inverting gates or vice versa. Correcting of logic inversion generally requires re-manufacturing all of the BEOL layers, or otherwise structurally integrating logic-controlled inverters or buffers into the device structure. In the latter case, these additional inverters or buffers require additional control circuits and may create timing delays. Such additional components also occupy additional surface area of the device layer.

SUMMARY

All aspects, examples and features mentioned below can be combined in any technically possible way.

Aspects of the disclosure provide a structure including: a first pair of complementary transistors connected in series between a first voltage node and a second voltage node, and each having a gate coupled to a first input node; a second pair of complementary transistors connected in series between the first voltage node and the second voltage node in an opposite orientation from the first pair of complementary transistors, and each having a gate coupled to a second input node; and an output line coupled to a first electrical connection between the first pair complementary transistors and a second electrical connection between the second pair of complementary transistors.

Further aspects of the disclosure provide a structure including: a first pair of complementary transistors connected in series between a first voltage node and a second voltage node, and each having a gate coupled to a first input node, wherein the first voltage node and the second voltage node are at different logic levels; a second pair of complementary transistors connected in series between the first voltage node and the second voltage node in an opposite orientation from the first pair of complementary transistors, and each having a gate coupled to a second input node; an output line coupled to a first electrical connection between the first pair complementary transistors and a second electrical connection between the second pair of complementary transistors; and a plurality of back end of line (BEOL) layers coupling the first pair of complementary transistors and the second pair of complementary transistors to the first voltage node and the second voltage node.

Additional aspects of the disclosure provide a method including: forming a first pair of complementary transistors connected in series between a first voltage node and a second voltage node, and each having a gate coupled to a first input node; forming a second pair of complementary transistors connected in series between the first voltage node and the second voltage node in an opposite orientation from the first pair of complementary transistors, and each having a gate coupled to a second input node; and coupling an output line to a first electrical connection between the first pair complementary transistors and a second electrical connection between the second pair of complementary transistors.

Two or more aspects described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
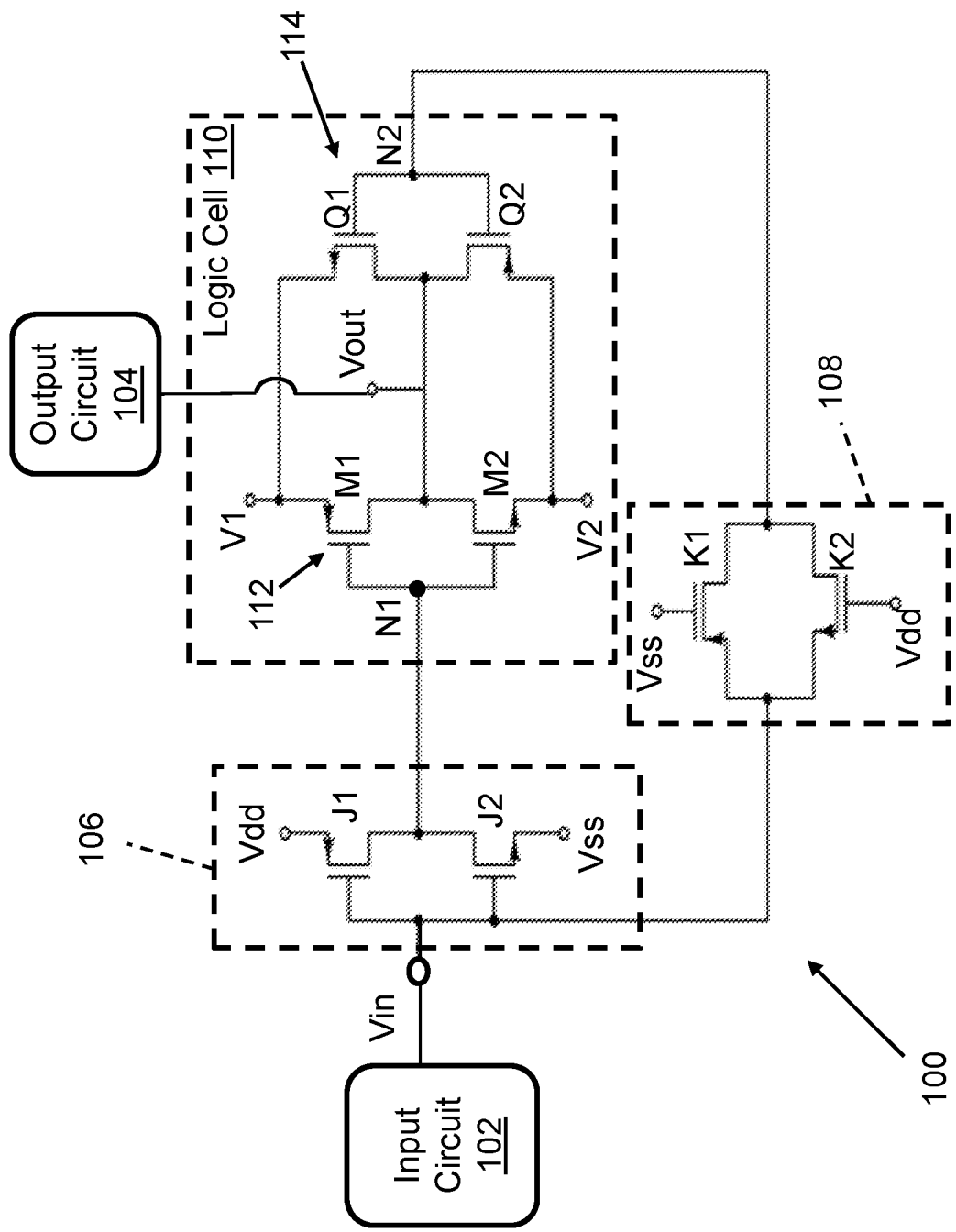
FIG. 1 shows a schematic view of a structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide a customizable logic cells and related methods to form the same. A structure of the disclosure includes a first pair of complementary transistors connected in series between a first voltage node and a second voltage node. Each transistor of the first pair includes a gate coupled to a first input node. A second pair of complementary transistors is connected in series between the first voltage node and the second voltage node in an opposite orientation from the first pair of complementary transistors. Each transistor of the second pair includes a gate coupled to a second input node. An output line is coupled to a first electrical connection between the first pair complementary transistors and a second electrical connection between the second pair of complementary transistors. The voltage node and second voltage node may be set to opposite logic levels (e.g., one being a high voltage such as the supply voltage and the other being ground). Structures of the disclosure may allow BEOL (back end of line) layers formed in later manufacturing phases to control, and thus customize, whether the structure will provide as a buffer or an inverter when manufacturing of the device concludes. These features of the disclosure may allow logic inversion errors to be corrected during manufacture without fully re-manufacturing the device layer and/or one or more earlier formed metal levels during BEOL processing.

Turning to FIG. 1, a schematic view of a structure 100 according to embodiments of the disclosure is provided. Structure 100 can include or otherwise be interposed between an input circuit 102, i.e., any circuit(s) configured to transmit data in the form of a voltage set to a high logic level or a low logic level, and an output circuit 104 for receiving the data output circuit 100. Input circuit 102 and output circuit 104 are distinguished solely on their positions relative to structure 100, and it is understood that structure 100, input circuit 102, and/or output circuit 104 each may be portions of a single circuit and/or assembly in some implementations. Structure 100 according to embodiments of the disclosure is customizable to act as a buffer for data transmitted from input circuit 102 to output circuit 104 (i.e., it may delay data passing therethrough without affecting the data), or an inverter (i.e., it may convert high logic level bits to low logic level bits or vice versa). The function of structure 100 may be configured by electrically coupling transistors therein to selected voltage levels, e.g., using metal wires within a back end layer of a device. In any case, structure 100 may provide or be electrically integrated into logic gate for implementing any desired logical function within a digital circuit. As discussed herein, structure 100 in the form of a logic gate may be programmable to provide a subset of desired logical functions.

Structure 100 may include a pair of parallel lines coupled to an input line (Vin) from input circuit 102, each providing a connection to an output line Vout. In the case where structure 100 functions as a buffer, the voltage at input line Vin will be the same as output line Vout. In the case where structure 100 functions as an inverter, the voltage at input line Vin and output line Vout will have opposite logic levels. The term "logic levels" refers to the logic level associated with a predetermined voltage or range of voltages. Specifically, voltages above a certain threshold will indicate a "high" or "one" logic level and voltages below the threshold will indicate a "low" or "zero" logic level in a "logical high" circuit, whereas these voltages will indicate the opposite logic levels in a "logical low" circuit. Embodiments of the disclosure are operable for use in logical high and logical low circuits without any modifications to structure 100.

An inverter 106 of structure 100 may include a pair of complementary transistors J1, J2 (i.e., a p-type field effect transistor ("PFET") and an n-type field effect transistor ("NFET")) connected together at a shared source/drain terminal and each having a gate coupled to input voltage Vin. Complementary transistors J1, J2 may couple a drain voltage ("Vdd," for example a power supply) to a source voltage ("Vss," for example ground) in series, such that the voltage of an electrical connection between complementary transistors J1, J2 is inverted relative to the gate terminal of each transistor J1, J2. The output from inverter 106 may be coupled to or otherwise define an input node N1 of a logic cell 110. The term "logic cell," as used herein, refers to a circuit configured to provide a customized logic function based on its connections to other voltages for operating the device in which it is formed. As will be discussed in detail herein, the electrical couplings to logic cell 110 may determine whether logic cell 110, in combination with inverter 106 and a delay element 108 discussed herein, will cause structure 100 to function as an inverter or a buffer.

Structure 100 may include a delay element 108 coupled to input line Vin in parallel with inverter 106. Delay element 108 may include a pair of delay transistors K1, K2. In contrast to inverter 106, delay inverters K1, K2 each may be coupled to input line Vin through a corresponding source/drain terminal and further may be coupled to another input node N2 of logic cell 110 through the other source/drain terminal. Each transistor K1, K2 of may have a gate coupled to drain voltage Vdd or source voltage Vss, such that current will pass through inverter 106 regardless of the logic of level of input line Vin or the operating state of structure 100. In this example, delay element 108 is shown to be a transmission gate but this is not required in all implementations. A transmission gate is an electrical component configured to transmit signals applied thereto with some amount of delay, i.e., in contrast to inverter 106 which replicates data in an inverted form at its output. Delay element 108 may include a PFET (e.g., K1) and an NFET (e.g., K2) connected in parallel between an input node and an output node. The gates of the PFET and the NFET are controllable via a control signal and an inverted control signal, respectively, applied to each gate. The logic level(s) of the control signal and inverted control signal may control whether the signal passes through each transistor of the transmission gate, or if no signal will pass between the input node and the output node. It is understood that any currently known or later developed electrical element for temporally separating an input and output node in a circuit (e.g., a digital buffer or other similar circuits) may be used in place of a transmission gate as delay element 108. Although delay element 108 will not affect the voltage of signals transmitted to send input node N2, the presence of buffer transistors will create an output signal at second input node N2 having coincident rising and falling edges with the rising and falling edge of any signals from inverter 106 transmitted to first input node N1.

Logic cell 110 may include two sets of complementary transistors in a configuration similar to that of inverter 106, discussed herein. A first pair of complementary transistors 112 (separately identified as M1, M2) each may have a gate coupled to first input node N1. M1 may be a p-type transistor (e.g., PFET) whereas M2 may be an n-type transistor (e.g., NFET) or vice versa. Each transistor M1, M2 of first pair further may include a first S/D material that is connected to the first S/D terminal of the other transistor, e.g., through a set of metal wires and vias, a shared silicide region, and/or any other type of electrical connection, and to output line Vout. The second S/D terminal of transistor M1 may be coupled to a first voltage node ("V1") and the second S/D terminal of transistor M2 may be coupled to a second voltage node ("V2"). During operation, each voltage node V1, V2 may be set to an opposite logic level compared to the other. In other words, first voltage node V1 may be set to logic high in the case where second voltage node V2 is set to logic low, and first voltage node V1 may be set to logic low in the case where second voltage node V2 is set to logic high.

Logic cell 110 also includes a second pair of complementary transistors 114 (separately identified as Q1, Q2). Similar to first pair 112, each transistor Q1, Q2 of second pair may be of a different type, e.g., transistor Q1 may be n-type (e.g., NFET) and transistor Q2 may be p-type (e.g., PFET). Second pair of complementary transistors 114, however, may be in an opposite configuration compared to first pair 112. That is, transistors Q1, Q2 may be coupled in series from second voltage node V2 to first voltage node V1 in the opposite order from first pair of complementary transistors 112. Each gate in second pair of complementary transistors may be coupled to second input node N2. Each transistor Q1, Q2 of second pair of complementary transistors also may include a first S/D terminal coupled to output line Vout. Transistors Q1, Q2 each may have a second S/D terminal that is coupled to the same voltage node as the second S/D terminal of its opposite counterpart in first pair of complementary transistors 112. Thus, second S/D terminal of transistor Q1 is coupled to first voltage node V1 and second S/D terminal of transistor Q2 is coupled to second voltage node V2. In other words: first voltage node V1 is coupled to the second S/D terminal of transistor M1 in first pair 112 and transistor Q2 in second pair 114; second voltage node V2 is coupled to the second S/D of transistor M2 in first pair 112 and transistor Q1 in second pair 114. During operation, the logic level of each voltage node V1, V2 will determine whether output line Vout of logic cell 110 will be derived from first input node N1 or second input node N2. As discussed herein, the logic level of each voltage node V1, V2 will cause only one pair of complementary transistors 112, 114 to invert the voltage of its respective input node N1, N2. This inverted signal is then transmitted to output circuit 104 through using output line Vout.

Figure 2:
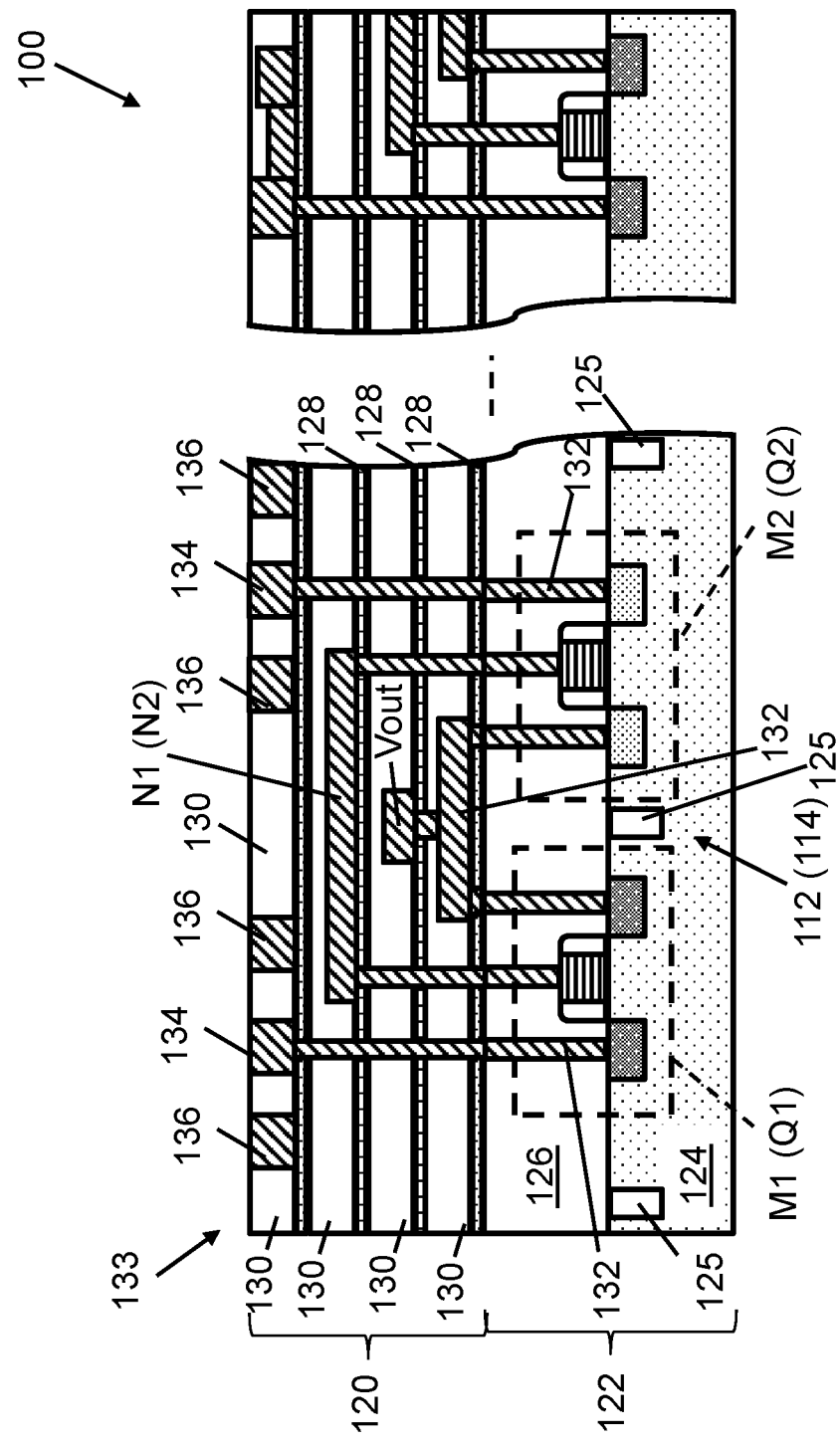
FIG. 2 shows a cross-sectional view of forming two transistors in a programmable structure according to methods of the disclosure.

Referring to FIG. 2, structure 100 may include a stack of back end of line (BEOL) layers 120 on a device layer 122 to connect logic cell 110 to metal wires, including power or grounding rails for providing a predetermined logic level. FIG. 2 depicts a cross-sectional view of first pair of complementary transistors 112 (i.e., transistors M1, M2) and first input node N1 in structure 100, this this same cross-sectional view also may represent second pair of complementary transistors 114, including transistors Q1, Q2, and second input node N2. Further explanation of FIG. 2 is relative to first pair of complementary transistors 112 but the features described herein may be the same for second pair of complementary transistors 114 as indicated by parentheses in FIG. 2.

Structure 100 may be on a substrate 124 including, e.g., one or more semiconductor materials. Substrate 124 may include but is not limited to silicon, germanium, silicon germanium (SiGe), silicon carbide, or any other common integrated circuit (IC) semiconductor substrates. In the case of SiGe, the germanium concentration in substrate 124 may differ from other SiGe-based structures described herein. A portion or entirety of substrate 124 may be strained. S/D terminals for each transistor M1, M2 may be formed within substrate 124, e.g., by introducing P-type or N-type dopants into targeted portions of substrate 124 to achieve a desired conductivity. Various conductive particles ("dopants") may be introduced into portions of substrate 124 to define the S/D terminals of each transistor M1, M2 by creating doped regions having varied polarities and/or concentrations. A "dopant" refers to an element introduced into semiconductor to establish either p-type (acceptors) or n-type (donors) conductivity. In the case of a silicon substrate, common dopants may include, e.g., boron (B), and/or indium (In), for p-type doping. For n-type doping, the doped element(s) may include, for example, phosphorous (P) arsenic (As), and/or antimony (Sb). Doping is the process of introducing impurities (dopants) into the semiconductor substrate, or elements formed on the semiconductor substrate, and is often performed with a mask (e.g., a film of photoresist material and/or other component to block dopants) in place so that only certain areas of the substrate will be doped. In the example of doping by implantation, an ion implanter may be employed.

A set of trench isolations (TIs) and an insulator 126, each including one or more dielectric materials (e.g., oxide and/or nitride insulators, and/or other insulating materials including those having a low dielectric constant (i.e., any insulating material(s) with a dielectric constant "k" of less than approximately 3.9)) may be on or within substrate 124 to cover and/or isolate first pair of complementary transistors 112. Together, substrate 124, TI(s) 125, insulator 126, and any active components formed therein may define device layer 122 of structure 100. BEOL layers 120 thus may include any/all components formed over those within device layer 122. Other portions of a device not defining and/or otherwise included within structure 100 may be included within BEOL layers 120 and/or device layer 122, and thus are shown in FIG. 2 and set apart from first pair of complementary transistors by a broken line to indicate an indeterminate separation distance.

BEOL layers 120 may include a set of barrier layers 128 alternating with inter-level dielectric (ILD) layers 130 to define a predetermined number of "metal level layers" over device layer 122. Although BEOL layers 120 include four distinct levels in FIG. 2, it is understood that any number (e.g., seven, twenty, or more) of metal level layers may be defined within BEOL layers 120. Barrier layers 128 may include, e.g., nitride insulators or similar materials suitable for defining the boundary between one metal level layer and another. Each barrier layer 128 may be formed on a previously defined layer (including device layer 122) by deposition. As discussed herein, metal wires and/or vias may be formed on barrier layer(s) 128 where desired to form electrical couplings through or within BEOL layers 120. ILD layers 130 may include oxide and/or other insulators suitable for occupying and electrically insulating the space adjacent metal wires within BEOL layers 120. ILD layers 130 may be formed, e.g., by forming a layer of insulating material over a previously formed barrier layer 128 to cover all previously formed material(s). The insulative material then can be planarized to define a flat upper surface, regardless of how many underlying materials and/or structure each ILD layer 130 covers.

Referring to FIGS. 1 and 2 together, first input node N1 may be include and/or be coupled to a conductor 132 such metal wire within one of BEOL layers 120, e.g., copper, aluminum, and/or other conducting metal(s) within BEOL layers 120. First input node N1 may be coupled to one S/D terminal of each transistor M1, M2 in first pair of complementary transistors 112 through conductor(s) such as vertically extending vias, and/or other horizontally extending wires within BEOL layers 120, as known in the art. Similarly, output line Vout may be coupled to the gate of each transistor M1, M2 in first pair of complementary transistors 112 through conductor(s) 132, e.g., one or more metal conductive wires or vias formed therein.

BEOL layers 120 may include a logic layer 133 for electrically determining the function of pair of complementary transistors 112 within structure 100. Logic layer 133 may not be structurally distinguishable from other metal levels within BEOL layers 120 and may be distinguishable solely based on its function of coupling the other S/D terminal of each transistor M1, M2 to a desired logic level. Each transistor M1, M2 may have an S/D coupled to a voltage node 134 through conductor(s) 132 in BEOL layers 120. Voltage node 134, when initially formed, may not be coupled to any other conductors 132 in BEOL layers 120. Logic layer 133 additionally may include a set of voltage rails 136, each of which may be coupled to a voltage source having the high logic level (i.e., "Vdd") or a voltage source having the low logic level (i.e., "Vss"). In a "logic high" device, the voltage source for the low logic level may simply be ground. Methods of the disclosure may include coupling one S/D terminal of each transistor M1, M2 to a desired logic level, e.g., by forming conductive material(s) to electrically connect voltage node 134 to a corresponding voltage rail 136, and thus tying each S/D terminal of pair of complementary transistors 112 to a desired logic level.

Figure 3A:
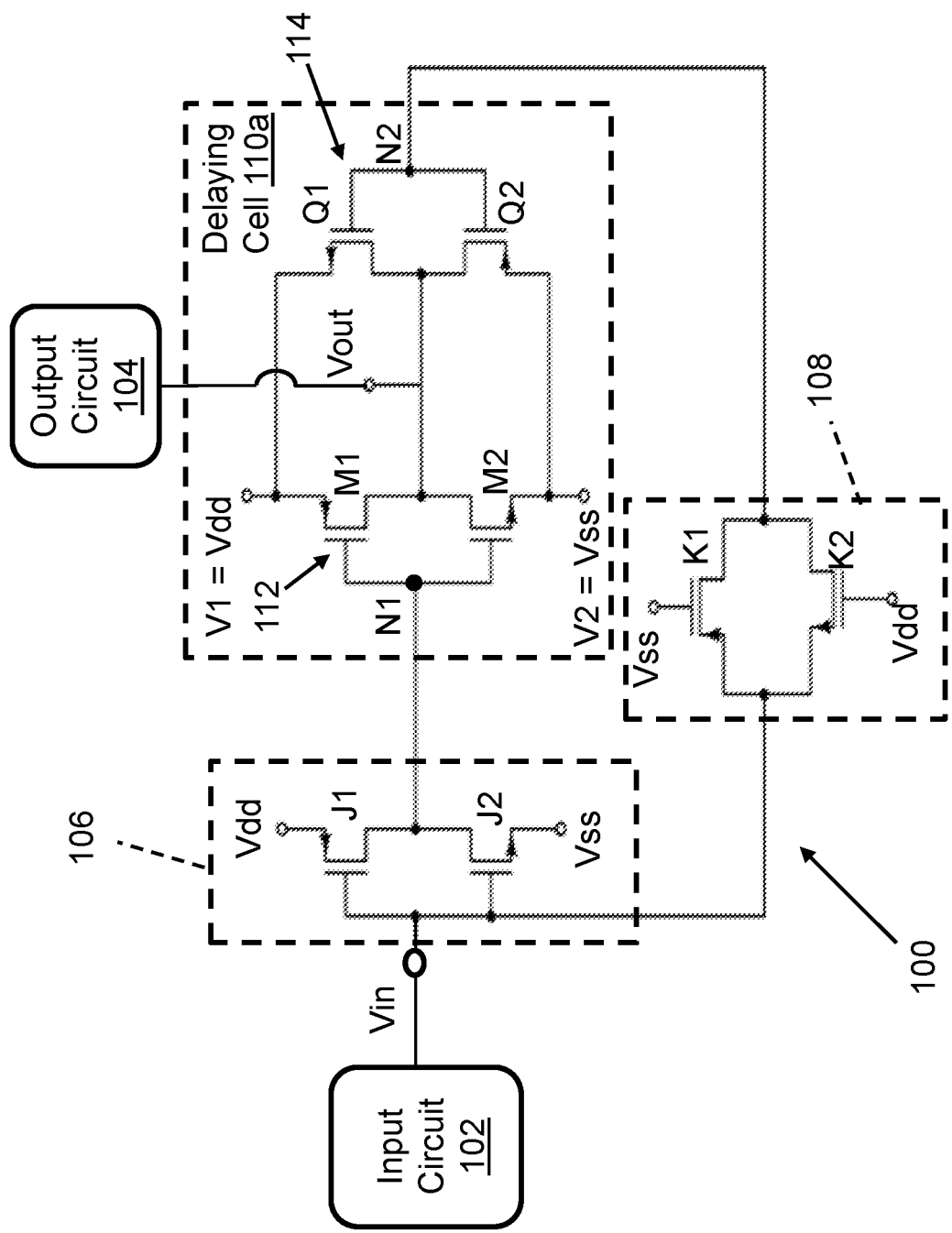
FIG. 3A shows as schematic view of a structure configured to provide a buffer according to embodiments of the disclosure.
Figure 3C:
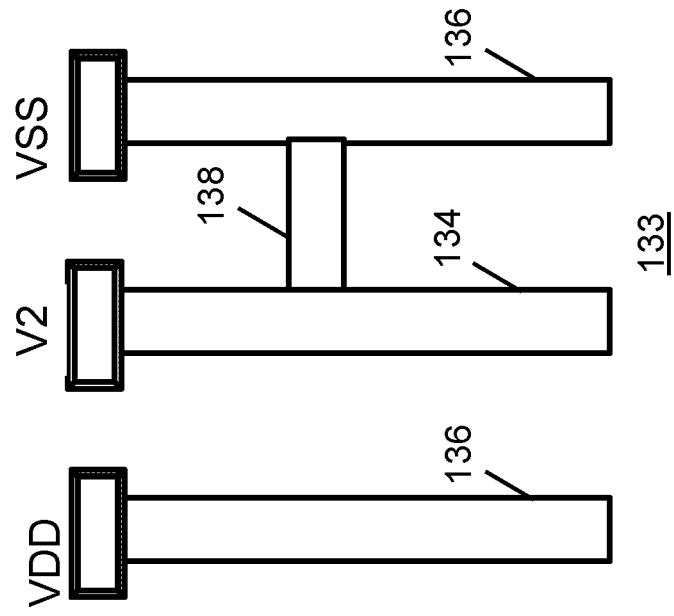
FIGS. 3B and 3C depict back end of line (BEOL) layers of a structure to provide a buffer according to embodiments of the disclosure.
Figure 3B:
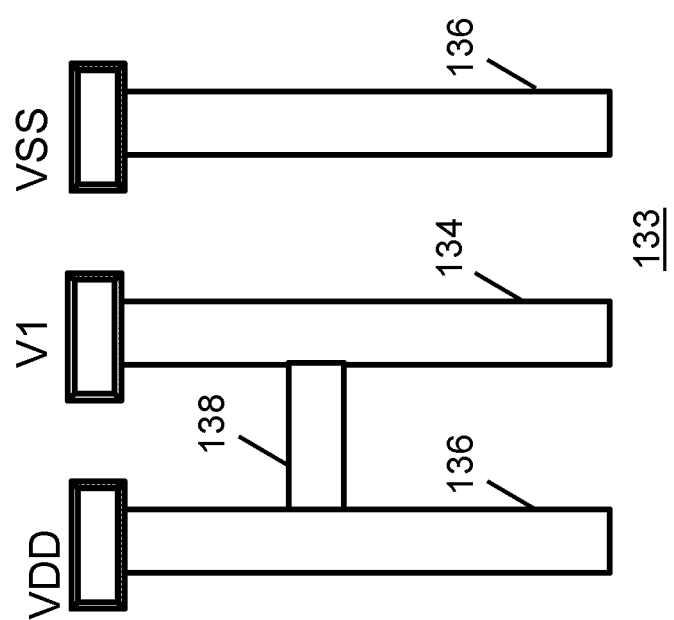

FIGS. 3A-3C depict a configuration of structure 100 in which logic cell 110 (FIG. 1) is configured to provide a delaying cell 110a. The details of structure 100 within device layer 122 (FIG. 2), including the other components of structure 100 discussed relative to FIG. 1, may be unchanged apart from couplings to first voltage node V1 and second voltage node V2. To provide delaying cell 110a, transistor M1 of first pair of complementary transistors 112 and transistor Q1 of second pair of complementary transistors 114 each may be coupled to drain voltage Vdd for a device. On the other hand, transistor M2 of first pair of complementary transistors 112 and transistor Q2 of second pair of complementary transistors 114 may be coupled to source voltage Vss (e.g., ground). Transistors M1, Q1 thus each have an S/D terminal set to logic high whereas transistors M2, Q2 each have an S/D terminal set to logic low. In the case where logic cell 110 functions as delaying cell 110a, structure 100 and its subcomponents (e.g., inverter 106, delay element 108, etc.) may be included within an "AND" gate, an "OR" gate, or an "exclusive or" ("XOR") gate.

FIGS. 3B and 3C depict plan views of logic layer 133 of BEOL layers 120. As shown specifically in FIGS. 3B and 3C, the desired voltage node levels may be provided by forming a connecting wire 138 from one voltage node 134 to a corresponding voltage rail 136. In the case of transistors M1, Q1, connecting wire 138 may connect voltage node 134 (defining first voltage node V1) to drain voltage Vdd through a corresponding voltage rail 136. In the case of transistors M2, Q2, connecting wire 138 may connect voltage node 134 (defining first voltage node V2) to source voltage Vss (e.g., ground) through a corresponding voltage rail 136. During operation, this configuration will cause first pair of complementary transistors 112 to act as a second inverter tied to inverter 106. The two inverters being coupled together will cause the output in output line Vout from delaying cell 110a to be the same as the voltage in input line Vout. Together, inverter 106, delay element 108 and delaying cell 110a will cause data at input line Vin to have the same information at output line Vout, i.e., because the two inverters negate each other and thus simply delay the signal as it travels from input circuit 102 to output circuit 104. Thus, structure 100 with delaying cell 110a will act as a buffer between circuits 102, 104.

Figure 4:
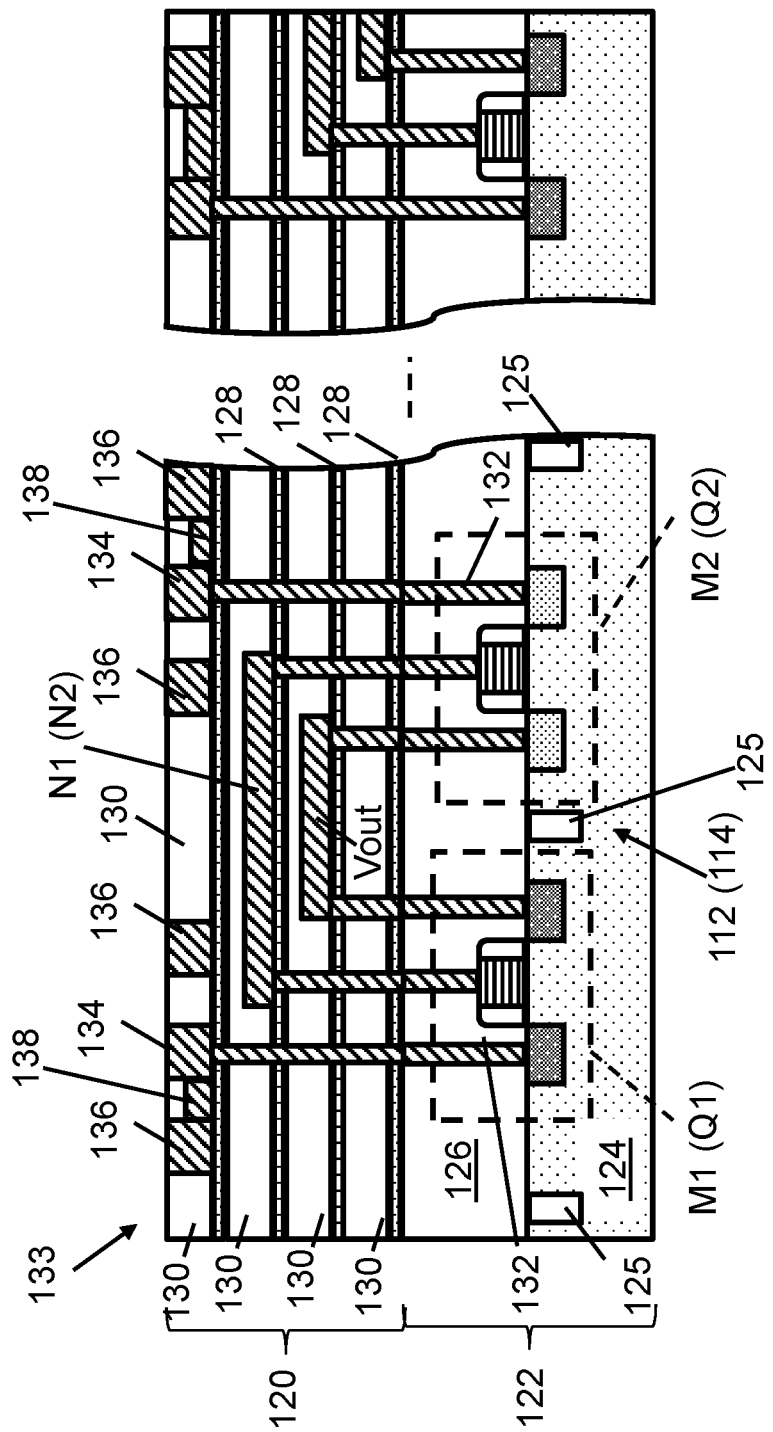
FIG. 4 shows a cross-sectional view of two transistors and back end layers connected to provide a buffer according to embodiments of the disclosure.

Turning to FIG. 4, embodiments of the disclosure include methods to form delaying cell 110a (FIG. 3A) from logic cell 110 (FIG. 1). According to an embodiment, methods of the disclosure may include forming connecting wire(s) 138 within BEOL layers 120 to connect each voltage node 134 to a desired voltage rail 136. Specifically, the method may include forming connecting wires 138 to couple an S/D terminal of transistors M1, Q1 to voltage rail(s) 136 set to logic high (e.g., drain voltage Vdd). The method also may include forming connecting wires 138 to couple an S/D terminal of transistors M2, Q2 to logic low (e.g., source voltage Vss or ground). In each case, connecting wire(s) 138 may be formed by removing a portion of ILD 130 in logic layer 133 and forming conductive material to create connecting wire(s) 138 where desired. In some cases, methods of the disclosure may include electrically testing the partially formed device, including logic cell 110 before programming, to determine where or whether connecting wires 138 are desired in logic layer 133.

Figure 5A:
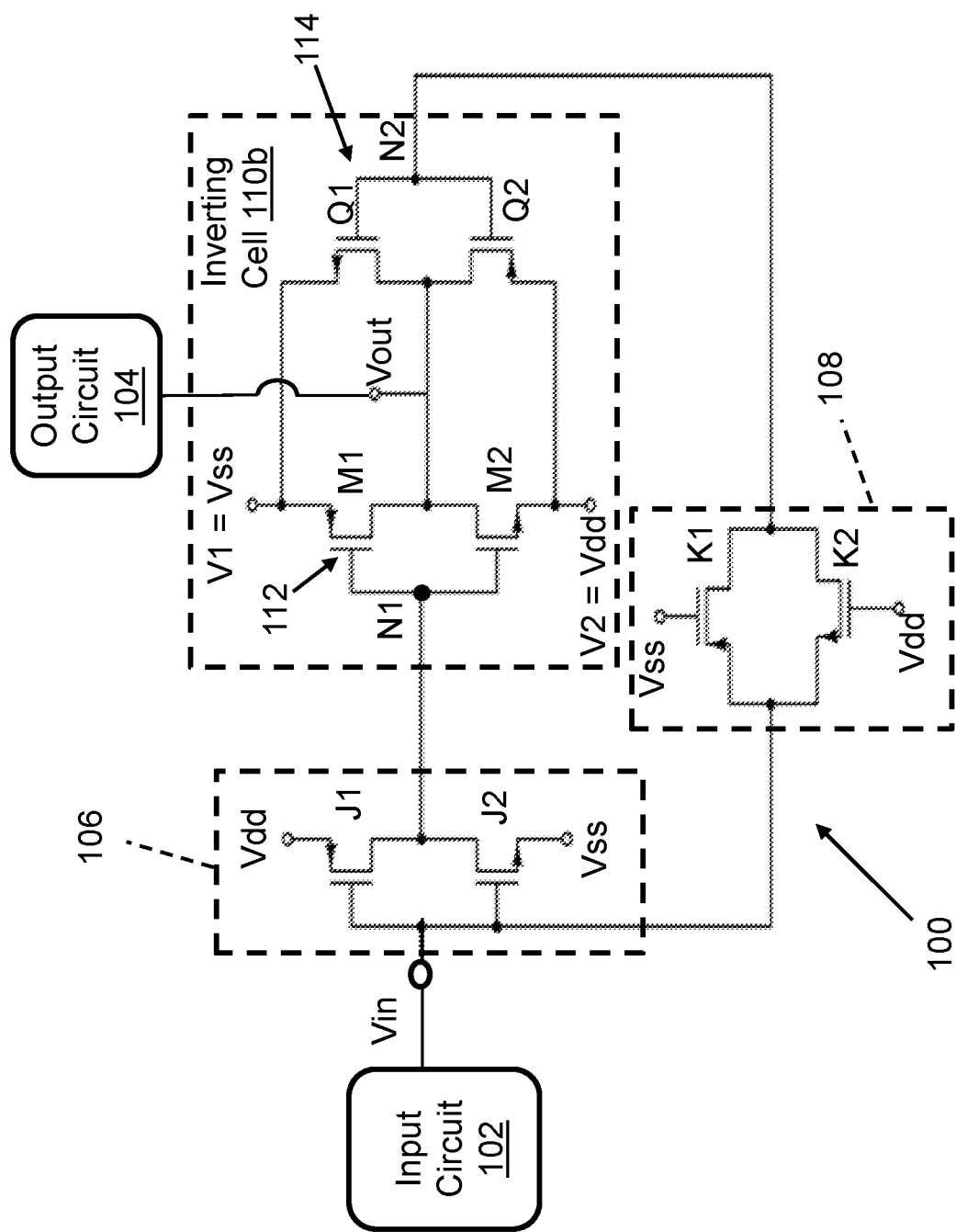
FIG. 5A shows a schematic view of a structure configured to provide an inverter according to embodiments of the disclosure.
Figure 5C:
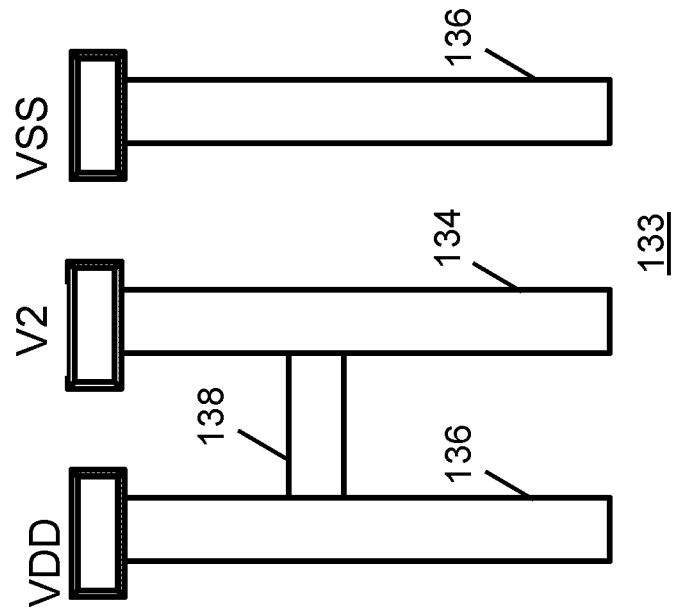
FIGS. 5B and 5C depict back end of line (BEOL) layers of a structure to provide an inverter according to embodiments of the disclosure.
Figure 5B:
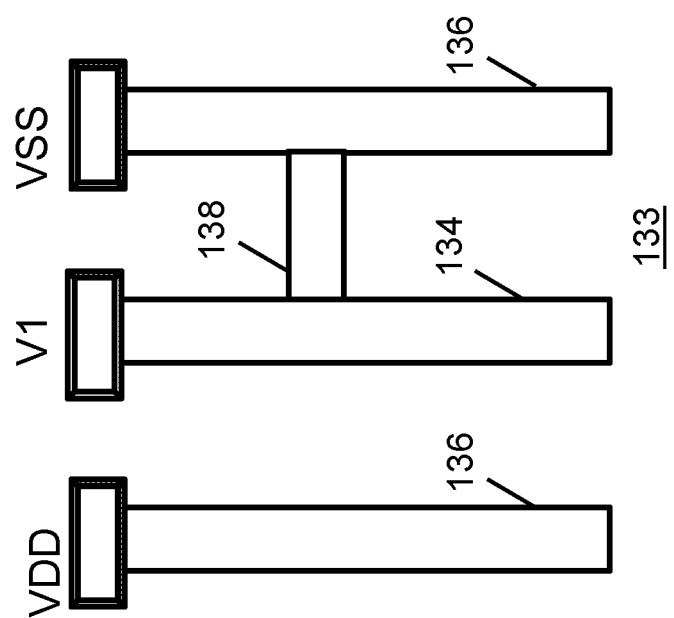

FIG. 5A-5C depict another configuration of structure 100 in which logic cell 110 (FIG. 1) is configured to provide an inverting cell 110b. This configuration may be provided by connecting the logic levels of first voltage node V1 and second voltage node V2 to each pair of complementary transistors 112, 114, relative to the configuration used for delaying cell 110a (FIGS. 3A-3C, 4). To provide inverting cell 110b, transistor M1 of first pair of complementary transistors 112 and transistor Q1 of second pair of complementary transistors 114 each may be coupled to source voltage Vss for a device, e.g., ground. Transistor M2 of first pair of complementary transistors 112 and transistor Q2 of second pair of complementary transistors 114 may be coupled to drain voltage Vdd. In other words, structure 100 may provide inverting cell 110b by connecting each transistor M1, M2, Q1, Q2 to the opposite logic level that would be used to create delaying cell 110a (FIG. 3A). Transistors M1, Q1 thus each have an S/D terminal set to logic low whereas transistors M2, Q2 each have an S/D terminal set to logic high. In the case where logic cell 110 functions as inverting cell 110b, structure 100 and its subcomponents (e.g., inverter 106, delay element 108, etc.) may be included within a "negative and" ("NAND") gate, a negative or ("NOR") gate, or an "exclusive nor" ("XNOR") gate.

FIGS. 5B and 5C depict plan views of logic layer 133 of BEOL layers 120. As shown specifically in FIGS. 5B and 5C, the desired voltage node levels may be provided by forming a connecting wire 138 from one voltage node 134 to a corresponding voltage rail 136. In the case of transistors M1, Q1, connecting wire 138 may connect voltage node 134 (defining first voltage node V1) to source voltage Vss (e.g., ground) through a corresponding voltage rail 136. In the case of transistors M2, Q2, connecting wire 138 may connect voltage node 134 (defining first voltage node V2) to drain voltage Vdd through a corresponding voltage rail 136. In this case, first pair of complementary transistors 112 will act as a buffer tied to first input node N1 (i.e., the output from inverter 106), and second pair of complementary transistors 114 will act as an inverter tied to second input node N2 (i.e., the output from delay element 108). Thus, structure 100 will invert incoming signals from input line Vin only one time to provide the opposite logic level in output line Vout. Together, inverter 106, delay element 108 and inverting cell 110b will cause data at input line Vin to have the opposite logic level at output line Vout, i.e., because only one inverter is between input line Vin from input circuit 102 and output line Vout to output circuit 104.

Figure 6:
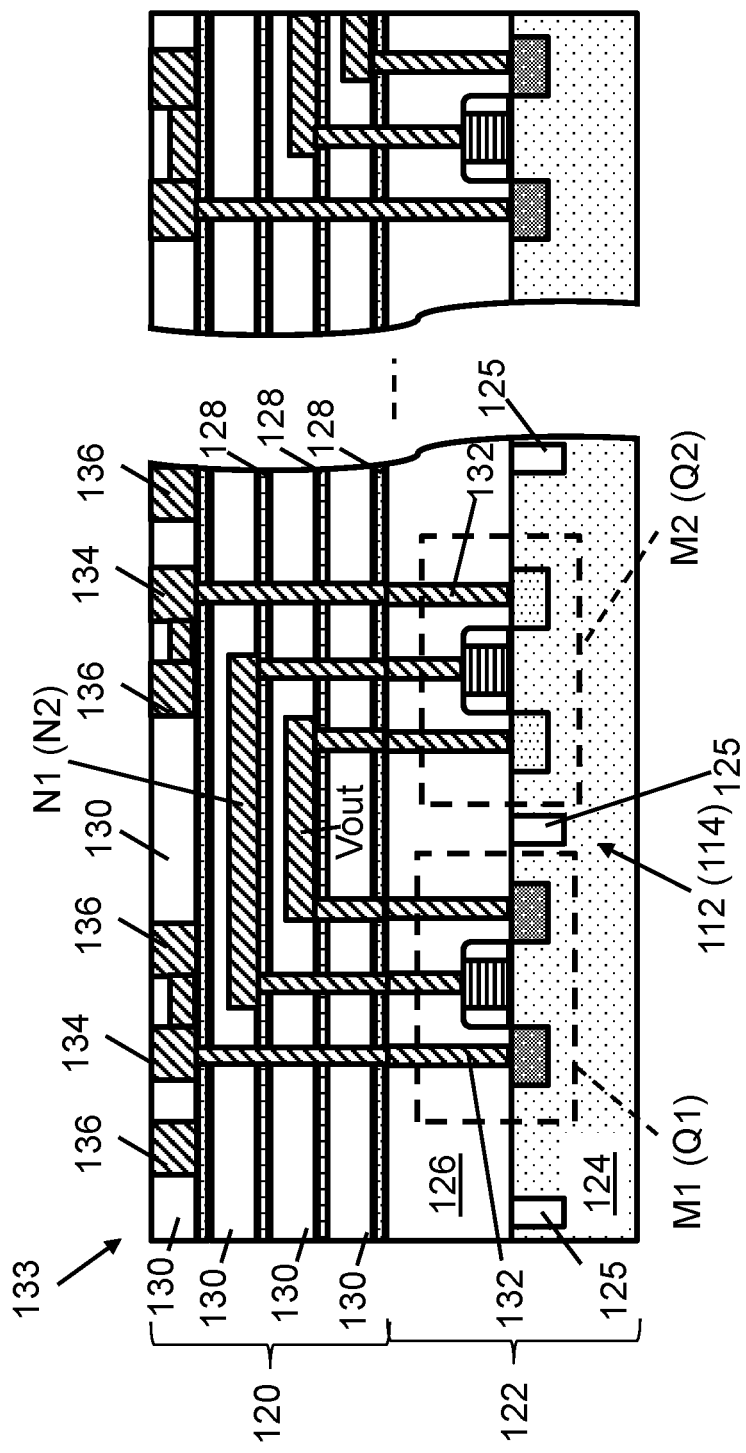
FIG. 6 shows a cross-sectional view of two transistors and back end layers connected to provide an inverter according to embodiments of the disclosure.

FIG. 6 depicts embodiments of a method to provide inverting cell 110b (FIG. 5A) from logic cell 110 (FIG. 1). The forming of inverting cell 110b may be similar to the forming of delaying cell 110a (FIG. 3A), apart from the voltage rails 136 selected for coupling to voltage nodes 134. According to an embodiment, methods of the disclosure may include forming connecting wire(s) 138 within BEOL layers 120 to connect each voltage node 134 to a desired voltage rail 136. Specifically, the method may include forming connecting wires 138 to couple an S/D terminal of transistors M1, Q1 to voltage rail(s) 136 set to logic low (e.g., source voltage Vss or ground). The method also may include forming connecting wires 138 to couple an S/D terminal of transistors M2, Q2 to logic high (e.g., drain voltage Vdd). In each case, connecting wire(s) 138 may be formed by removing a portion of ILD 130 in logic layer 133 and forming conductive material to create connecting wire(s) 138 where desired. In some cases, methods of the disclosure may include electrically testing the partially formed device, including logic cell 110 before programming, to determine where or whether connecting wires 138 are desired in logic layer 133.

Embodiments of the disclosure provide various technical and commercial advantages, examples of which are discussed herein. Structure 100 enables logic inversion errors within a device to be corrected without re-manufacturing of device layer 122 (FIGS. 2, 4, 6) by forming corrective connections withing logic layer(s) 133 (FIGS. 2, 3B, 3C, 4, 5B, 5C, 6) of BEOL layers 120. Embodiments of structure 100 can alternatively provide delaying cell 110a (FIG. 3A) for an AND, OR, or XOR gate, or may provide inverting cell 110b (FIG. 5A) of a NAND, NOR, or XNOR gate. Additionally, embodiments of the disclosure may preserve the original power supply lines and connections thereto of a structure, thus enabling corrective changes to logic circuits to be implemented by way of connecting wires 138 (FIGS. 3B, 3C, 4, 5B, 5C, 6) within BEOL layers 120. Among other benefits, embodiments of structure 100 reduce the costs of testing and (where applicable) modifying a logic circuit of a device for manufacture. These benefits furthermore may be realized without any substantial change to the timing requirements of logic, e.g., they simply may use couplings to power or grounding cells to create a buffer or inverter where needed.

Aspects of the present disclosure are described above with reference to flowchart illustrations and/or block diagrams of methods and apparatus (systems) according to embodiments of the disclosure. It will be understood that each block of the flowchart illustrations and/or block diagrams, and combinations of blocks in the flowchart illustrations and/or block diagrams, can be implemented by hardware and/or software (e.g., computer program instructions). Where implemented with the aid of computer program instructions, such instructions for implementing methods of the disclosure may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As used herein, the term "configured," "configured to" and/or "configured for" can refer to specific-purpose patterns of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a first pair of complementary transistors connected in series between a first voltage node and a second voltage node, and each having a gate coupled to a first input node;
    a second pair of complementary transistors connected in series between the first voltage node and the second voltage node in an opposite orientation from the first pair of complementary transistors, and each having a gate coupled to a second input node;
    an input line for receiving input signals from an input circuit;
    an output line coupled to a first electrical connection between the first pair complementary transistors and a second electrical connection between the second pair of complementary transistors;
    an inverter, wherein the first input node is coupled to an inverter output to receive an inverted input signal; and
    a delay element, wherein the second input node is coupled to a delay element output of the delay element to receive a delayed input signal,
    wherein the inverter and the delay element are each directly coupled to the input line in parallel, and
    wherein the output line has a same logic level as the inverted input signal in response to the first voltage node being coupled to a supply voltage and the second voltage node being coupled to ground.

2. The structure of claim 1, wherein the first voltage node and the second voltage node are at different logic levels.

3. The structure of claim 1, wherein the first input node is coupled to an inverter output to receive an inverted input signal, the second input node is coupled to a delay element output to receive a delayed input signal.

4. The structure of claim 1, wherein a plurality of back end of line (BEOL) layers couple the first pair of complementary transistors and the second pair of complementary transistors to the first voltage node and the second voltage node.

5. The structure of claim 1, wherein the delay element includes a transmission gate.

6. A structure comprising:
a first pair of complementary transistors connected in series between a first voltage node and a second voltage node, and each having a gate coupled to a first input node, wherein the first voltage node and the second voltage node are at different logic levels;
a second pair of complementary transistors connected in series between the first voltage node and the second voltage node in an opposite orientation from the first pair of complementary transistors, and each having a gate coupled to a second input node;
an input line for receiving input signals from an input circuit;
an output line coupled to a first electrical connection between the first pair complementary transistors and a second electrical connection between the second pair of complementary transistors; and
an inverter, wherein the first input node is coupled to an inverter output to receive an inverted input signal; and
a delay element, wherein the second input node is coupled to a delay element output of the delay element to receive a delayed input signal,
wherein the inverter and the delay element are each directly coupled to the input line in parallel with a plurality of back end of line (BEOL) layers coupling the first pair of complementary transistors and the second pair of complementary transistors to the first voltage node and the second voltage node, and
wherein the output line has a same logic level as the inverted input signal in response to the first voltage node being coupled to a supply voltage and the second voltage node being coupled to ground.

7. The structure of claim 6, wherein the first input node is coupled to an inverter output to receive an inverted input signal, the second input node is coupled to a delay element output to receive a delayed input signal.

8. The structure of claim 7, wherein the inverter and the delayed input signal are coupled to a same input line such that edges of the inverted input signal are concurrent with edges of the delayed input signal.

9. The structure of claim 6, wherein the first pair of complementary transistors includes a first P-type transistor coupled to the first voltage node and a first N-type transistor coupled to the second voltage node, and the second pair of complementary transistors includes a second N-type transistor coupled to the first voltage node and a second P-type transistor coupled to the second voltage node.

10. The structure of claim 6, wherein the delay element includes a transmission gate.

11. A method comprising:
forming a first pair of complementary transistors connected in series between a first voltage node and a second voltage node, and each having a gate coupled to a first input node;
forming a second pair of complementary transistors connected in series between the first voltage node and the second voltage node in an opposite orientation from the first pair of complementary transistors, and each having a gate coupled to a second input node;
coupling an input line for receiving input signals to an input circuit;
coupling an output line to a first electrical connection between the first pair complementary transistors and a second electrical connection between the second pair of complementary transistors;
coupling the first input node to an inverter output from an inverter to receive an inverted input signal;
coupling the second input node to a delay element to receive a delayed input signal,
wherein the inverter and the delay element are each directly coupled to the input line in parallel; and
coupling the first voltage node to a supply voltage and coupling the second voltage node to ground, wherein the output line has a same logic level as the inverted input signal in response to the first voltage node being coupled to a supply voltage and the second voltage node being coupled to ground.

12. The method of claim 11, further coupling the first voltage node and the second voltage node are at different logic levels.

13. The method of claim 11, further coupling the first voltage node and the second voltage node are at different logic levels through a plurality of back end of line (BEOL) layers.

14. The method of claim 11, further comprising:
coupling the first input node to an inverter output to receive an inverted input signal; and
coupling the second input node to a delay element output to receive a delayed input signal.

* * * * *